United States Patent
Behrends et al.

(10) Patent No.: US 7,924,633 B2
(45) Date of Patent: Apr. 12, 2011

(54) IMPLEMENTING BOOSTED WORDLINE VOLTAGE IN MEMORIES

(75) Inventors: Derick Gardner Behrends, Rochester, MN (US); Todd Alan Christensen, Rochester, MN (US); Travis Reynold Hebig, Rochester, MN (US); Daniel Mark Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 12/389,420

(22) Filed: Feb. 20, 2009

(65) Prior Publication Data

US 2010/0214859 A1    Aug. 26, 2010

(51) Int. Cl.
*G11C 7/00* (2006.01)

(52) U.S. Cl. .......... 365/189.11; 365/189.09; 365/203; 365/185.23; 365/230.06

(58) Field of Classification Search ......... 365/189.11, 365/189.09, 203, 185.23, 230.06
See application file for complete search history.

(56) References Cited

U.S. PATENT DOCUMENTS

| | | | | |
|---|---|---|---|---|
| 5,153,467 A | * | 10/1992 | Mao | 326/80 |
| 5,253,204 A | * | 10/1993 | Hatakeyama et al. | 365/189.06 |
| 5,307,315 A | * | 4/1994 | Oowaki et al. | 365/189.09 |
| 5,367,489 A | * | 11/1994 | Park et al. | 365/189.11 |
| 5,381,373 A | * | 1/1995 | Ohsawa | 365/201 |
| 5,708,387 A | * | 1/1998 | Cleveland et al. | 327/536 |
| 5,875,133 A | * | 2/1999 | Miyashita et al. | 365/189.09 |
| 6,044,035 A | * | 3/2000 | Kohno | 365/230.06 |
| 6,115,319 A | * | 9/2000 | Kinoshita et al. | 365/233.14 |
| 6,240,037 B1 | * | 5/2001 | Kuwabara | 365/228 |
| 6,724,679 B2 | * | 4/2004 | Nagasawa et al. | 365/230.03 |
| 6,859,386 B2 | * | 2/2005 | Izutsu | 365/154 |
| 7,180,818 B2 | * | 2/2007 | Joshi et al. | 365/230.05 |
| 7,269,091 B2 | * | 9/2007 | Ueda | 365/230.06 |
| 7,394,701 B2 | * | 7/2008 | Jung et al. | 365/185.23 |
| 7,403,418 B2 | | 7/2008 | Lin et al. | |
| 7,693,004 B2 | * | 4/2010 | Tsukude | 365/230.06 |

* cited by examiner

*Primary Examiner* — Viet Q Nguyen
(74) *Attorney, Agent, or Firm* — Joan Pennington

(57) ABSTRACT

A method and wordline voltage boosting circuit for implementing boosted wordline voltage in memories, and a design structure on which the subject circuit resides are provided. The wordline voltage boosting circuit receives a precharge signal, uses a switching transistor coupled to a bootstrap capacitor, and generates a boosted voltage level responsive to the precharge signal. The boosted voltage level is applied to a voltage supply of an output stage of a wordline driver, causing the wordline voltage level of a selected wordline to be boosted. The switching transistor is controlled by the precharge signal and a node of the bootstrap capacitor supplying the boosted voltage level is driven high by the switching transistor.

17 Claims, 4 Drawing Sheets

IMPLEMENTING BOOSTED WORDLINE VOLTAGE IN MEMORIES

FIELD OF THE INVENTION

The present invention relates generally to the data processing field, and more particularly, relates to a method and circuit for implementing boosted wordline voltage in memories, and a design structure on which the subject circuit resides.

DESCRIPTION OF THE RELATED ART

As technology nodes progress and static random access memory (SRAM) cells shrink in area, often an additional higher voltage power supply is necessary to maintain adequate SRAM yield and performance.

Such additional power supply is often used to boost the wordline voltage driving the SRAM cells. However, the addition of a power supply adds chip and card cost due to additional regulators along with tradeoff of additional chip area or reduced power supply distribution robustness.

U.S. Pat. No. 7,403,418 issued Jul. 22, 2008 to Lin et al. discloses a wordline voltage boosting circuit for boosting the wordline voltage that uses an additional capacitor connected to each wordline. This is also a very high area arrangement.

A need exists for a wordline voltage boosting circuit that efficiently and effectively boosts a voltage level for a wordline while minimizing required chip area to implement the wordline voltage boosting circuit. A need exists to incorporate such wordline voltage boosting circuit into a domino read SRAM.

SUMMARY OF THE INVENTION

Principal aspects of the present invention are to provide a method and circuit for implementing boosted wordline voltage in memories, and a design structure on which the subject circuit resides. Other important aspects of the present invention are to provide such method, circuit and design structure substantially without negative effect and that overcome many of the disadvantages of prior art arrangements.

In brief, a method and wordline voltage boosting circuit for implementing boosted wordline voltage in memories, and a design structure on which the subject circuit resides are provided. The wordline voltage boosting circuit receives a precharge signal, uses a switching transistor coupled to a bootstrap capacitor, and generates a boosted voltage level responsive to the precharge signal. The boosted voltage level is applied to a voltage supply of an output stage of a wordline driver, causing the wordline voltage level of a selected wordline to be boosted.

In accordance with features of the invention, the switching transistor is controlled by the precharge signal. A node of the bootstrap capacitor supplying the boosted wordline voltage level is driven high by the switching transistor.

In accordance with features of the invention, the increased wordline voltage generated by the wordline voltage boosting circuit improves read access time and write time of a domino read static random access memory (SRAM).

The wordline voltage boosting circuit includes the bootstrap capacitor, a P-channel field effect transistor (PFET) implementing the switching transistor, and a pair of series connected inverters. The PFET receives a gate input of the precharge signal and is connected between a voltage supply rail and a first side of the bootstrap capacitor supplying the boosted wordline voltage level. The pair of series connected inverters receives an input of the precharge signal PRCH and includes an output connected to a second side of the bootstrap capacitor.

In accordance with features of the invention, the wordline voltage boosting circuit shares a single bootstrap capacitor across the group of wordline drivers minimizing required chip area.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
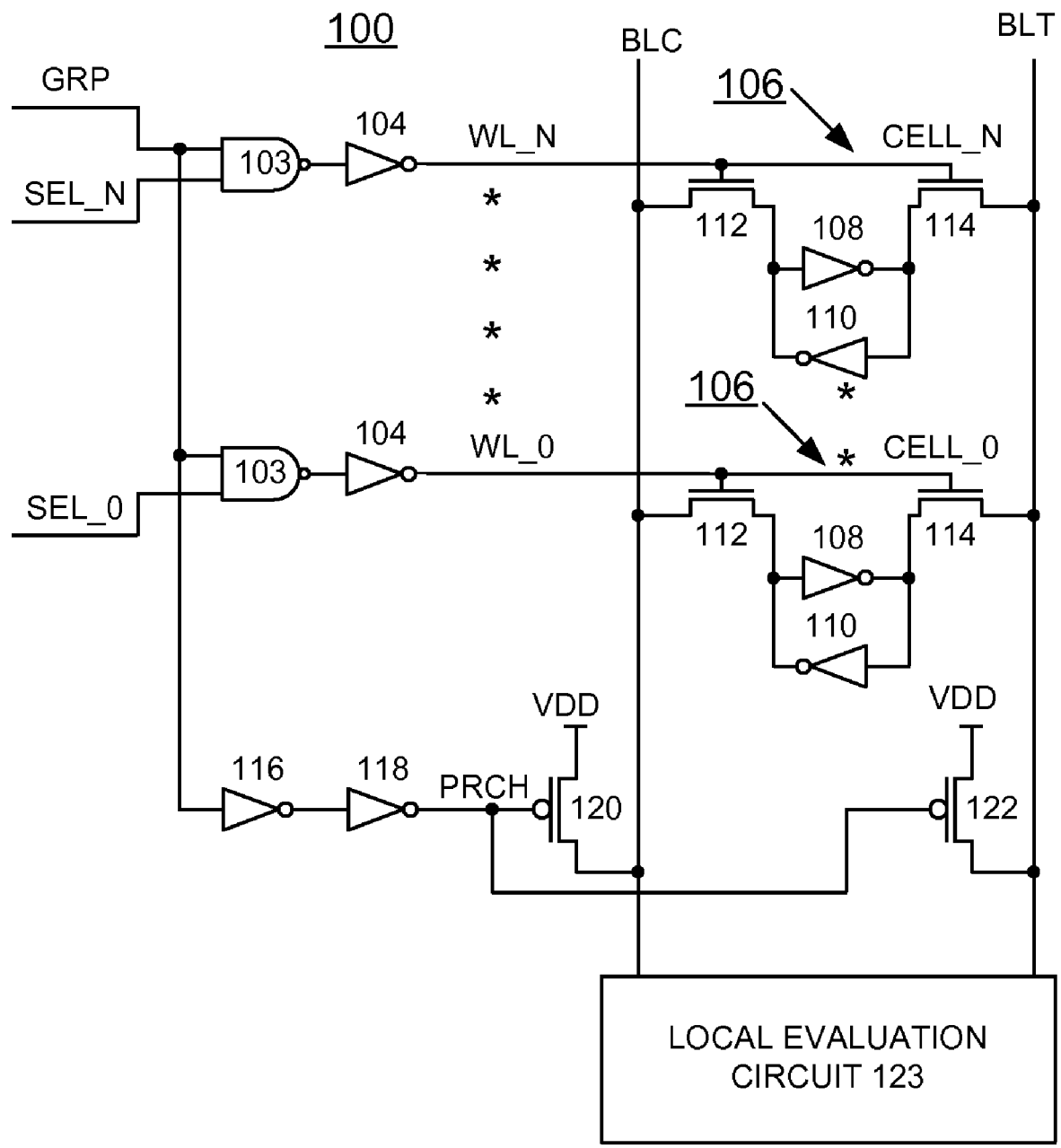
FIG. 1 is a schematic diagram of a prior art wordline driver and decoder circuit for domino read static random access memory (SRAM) cells.

FIG. 1 illustrates a prior art static wordline driver and decoder random access memory (SRAM) circuit 100 for a domino read SRAM. As shown, the prior art wordline driver and decoder circuit 100 includes a respective NAND gate 103 receiving a group select signal GRP and a respective wordline select input SEL_0, SEL_N and applying a NAND output to an inverter 104 connected to a respective wordline WL_0, WL_N providing an input to a respective memory cell 106, 0-N. Each of the memory cells 106, 0-N includes a pair of cross-coupled inverters 108, 110 for storing data and a pair of transistors 112, 114 used to obtain access to the memory cell. A respective wordline input WL_0, WL_N provides a gate input to the N-channel field effect transistor (NFETs) 112, 114. A particular wordline input WL_0, WL_N is activated, turning on respective NFETs to perform a read or write operation. A pair of series connected inverters 116, 118 receiving the group select signal GRP provides a precharge gate input PRCH to a pair of P-channel field effect transistor (PFETs) 120, 122. The PFETs 120, 122 are precharge PFETs connected between a voltage supply rail VDD and a respective bitline BLC, BLT. The bitlines BLC, BLT are connected to a local evaluation circuit 123 and respective NFETs 112, 114 of each of the memory cells 106, 0-N.

Figure 2:
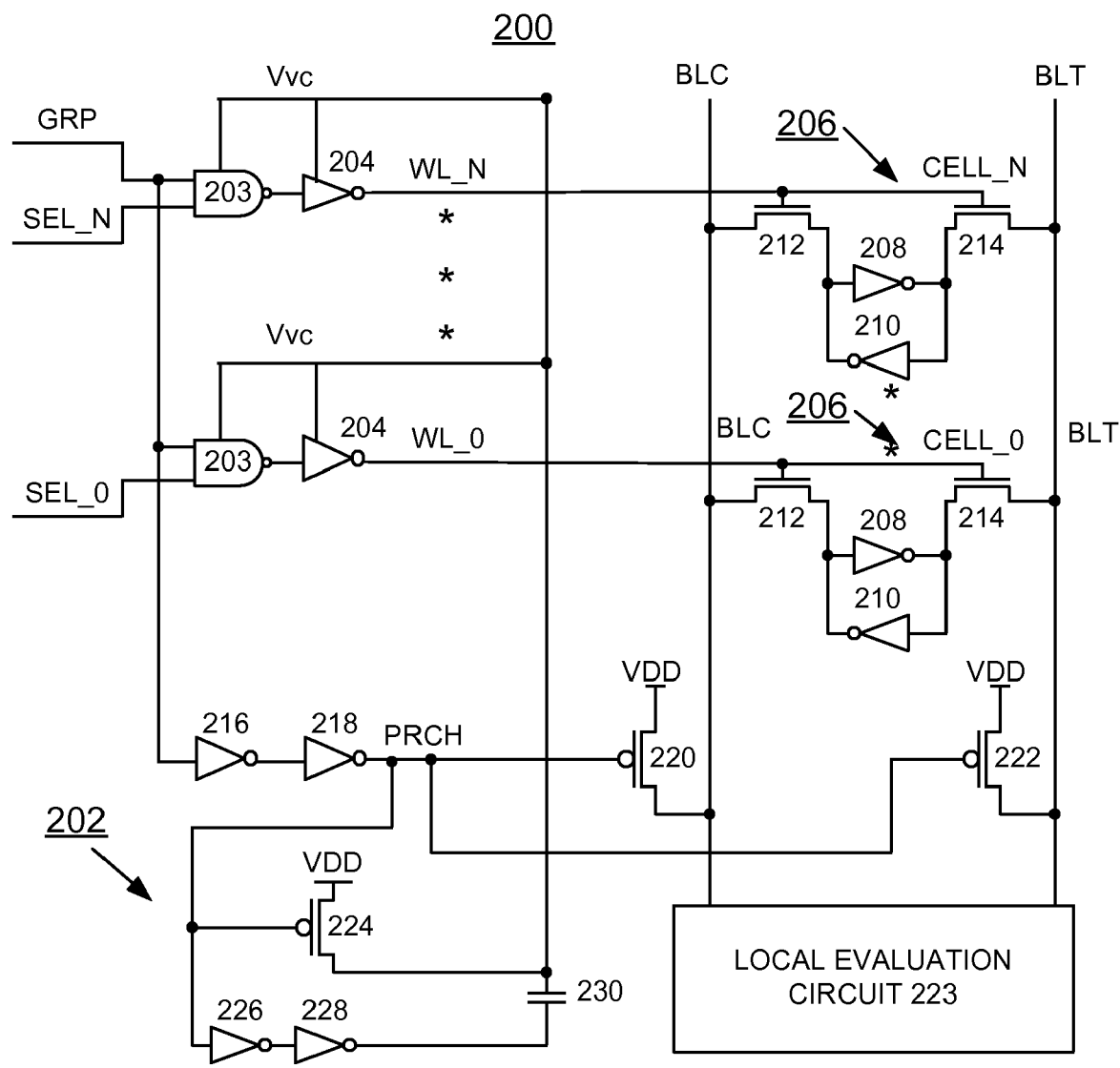
FIG. 2 is a schematic diagram of a wordline driver and decoder circuit for domino read static random access memory (SRAM) cells with a wordline voltage boosting circuit in accordance with the preferred embodiment.

Having reference now to FIG. 2, there is shown a wordline driver and decoder random access memory (SRAM) circuit for domino read SRAM generally designated by the reference character 200 with a wordline voltage boosting circuit generally designated by the reference character 202 in accordance with the preferred embodiment.

The wordline driver and decoder SRAM circuit 200 includes a respective NAND gate 203 receiving a group select signal GRP and a respective wordline select input SEL_0, SEL_N and applying a NAND output to an inverter 204 connected to a respective wordline WL_0, WL_N providing an input to a respective memory cell 206, 0-N. Each of the memory cells 206, CELL_0-CELL_N includes a pair of cross-coupled inverters 208, 210 for storing data and a pair of transistors 212, 214 used to obtain access to the memory cell. A respective wordline input WL_0, WL_N provides a gate input to the N-channel field effect transistor (NFETs) 212, 214. A particular wordline input WL_0, WL_N is activated, turning on respective NFETs 212, 214 to perform a read or write operation. A pair of series connected inverters 216, 218 receiving the group select signal GRP provides a gate input precharge signal PRCH to a pair of P-channel field effect transistors (PFETs) 220, 222. The PFETs 220, 222 are precharge PFETs connected between a voltage supply rail VDD and a respective bitline BLC, BLT. The bitlines BLC, BLT are connected to a local evaluation circuit 223 and respective NFETs 212, 214 of each of the memory cells 206, 0-N.

The group select signal GRP and the respective wordline select signals SEL_0, SEL_N determine which wordline, WL_0 through WL_N, is activated. The contents of the corresponding SRAM cell 206, CELL_0 through CELL_N, for the particular activated wordline, WL_0, WL_N are then read by the local evaluation circuit 223 via bitlines, BLC, BLT. The group signal GRP is used to control the precharging of the bitlines BLC, BLT. The precharge signal PRCH is connected to precharge devices 220, 222.

In accordance with features of the invention, the wordline voltage boosting circuit 202 receives the precharge signal PRCH and generates a boosted wordline voltage level Vvc, which is applied to a voltage supply of the NAND gate 203 and the inverter 204, which together define an output stage of a wordline driver.

In accordance with features of the invention, the increased wordline voltage generated by the wordline voltage boosting circuit 202 improves read access time and write time of the SRAM.

The wordline voltage boosting circuit 202 includes a P-channel field effect transistor (PFET) 224 receiving a gate input of the precharge signal PRCH and pair of series connected inverters 226, 228 receiving the precharge signal PRCH and connected to a capacitor 230. The PFET 224 is connected between a voltage supply rail VDD and the capacitor 230 at node Vvc of the boosted wordline voltage level Vvc.

In operation of the wordline voltage boosting circuit 202, the bootstrap capacitor 230 boosts the voltage level of the active wordline WL_0, WL_N. By connecting the voltage supply of the NAND gate 203 and inverter 204 of the wordline driver to the net Vvc, the voltage level of the active wordline WL_0, WL_N is boosted when the net Vvc is driven high by PFET 224. When the group signal GRP followed by the precharge signal PRCH for the particular selected group of wordlines goes high, the voltage level of net Vvc is boosted. This causes the voltage level of the selected wordline to be boosted, while the voltage level of the other wordlines in the group of wordlines stay low.

In accordance with features of the invention, only one bootstrap capacitor is used for each group of wordlines WL_0, WL_N. This sharing of the bootstrap capacitor minimizes the area of the wordline voltage boosting circuit 202. Also, the wordline voltage boosting circuit 202 enables improved performance without introducing a second power supply, which decreases the system cost.

In the illustrated wordline driver and decoder SRAM circuit 200, only one group of wordlines is shown. It should be understood that the present invention is not limited to the illustrated wordline driver and decoder SRAM circuit 200 with only one group of wordlines. In a typical implementation of the invention, these circuits 200 are repeated and additional group signals are provided. One of the group signals is activated to determine the group from which a particular active wordline is selected.

Figure 3:
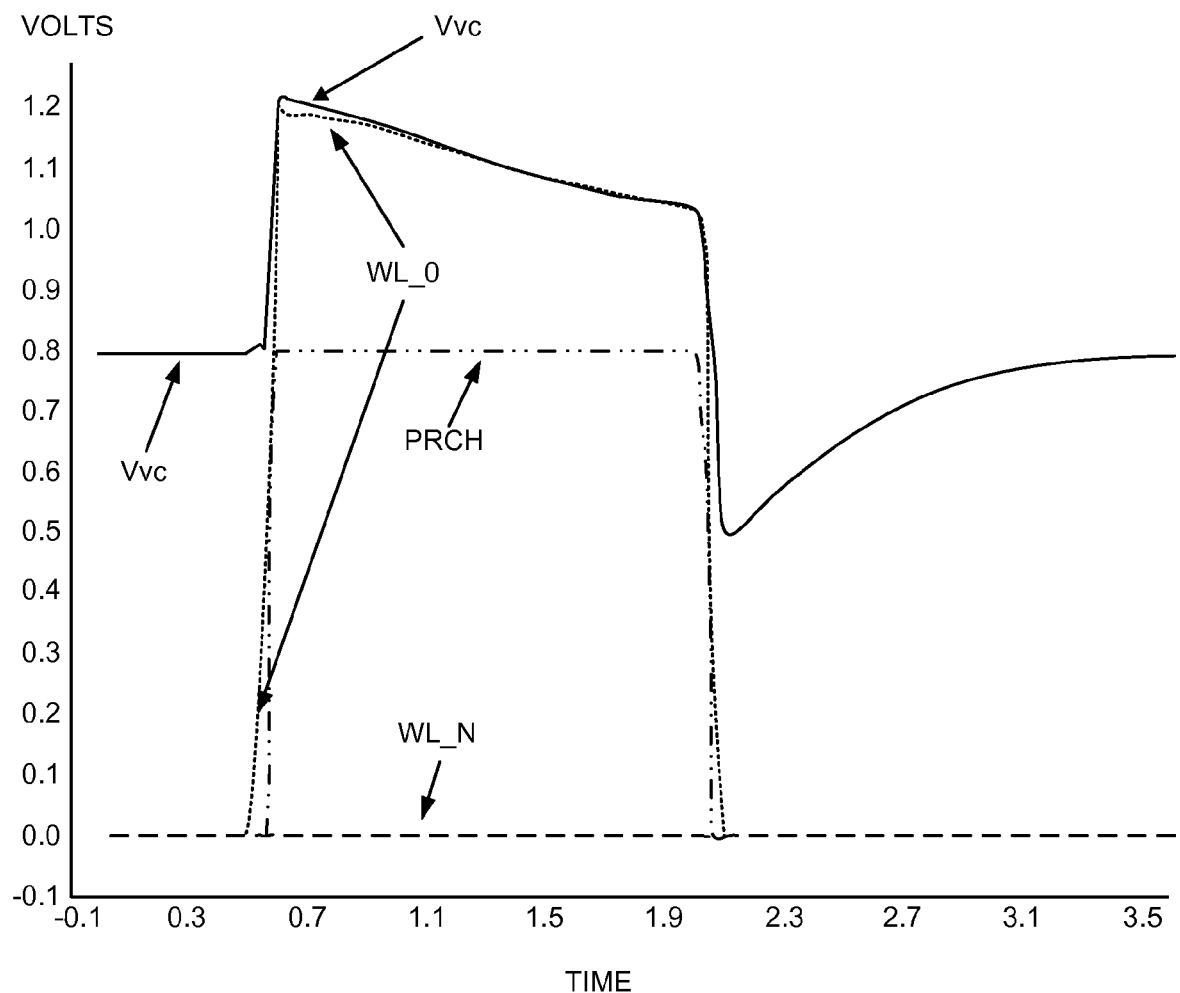
FIG. 3 is a timing diagram illustrating the operation of the wordline voltage boosting circuit of FIG. 2 in accordance with the preferred embodiment.

FIG. 3 is a timing diagram illustrating the operation of the wordline driver and decoder SRAM circuit 200 with the wordline voltage boosting circuit 202 of FIG. 2 in accordance with the preferred embodiment. Voltage is plotted along the vertical axis in volts with respect to time along the horizontal axis. As shown in FIG. 3, the wordline WL_0 is active and is boosted, while the illustrated wordline WL_N is not active and remains low.

Figure 4:
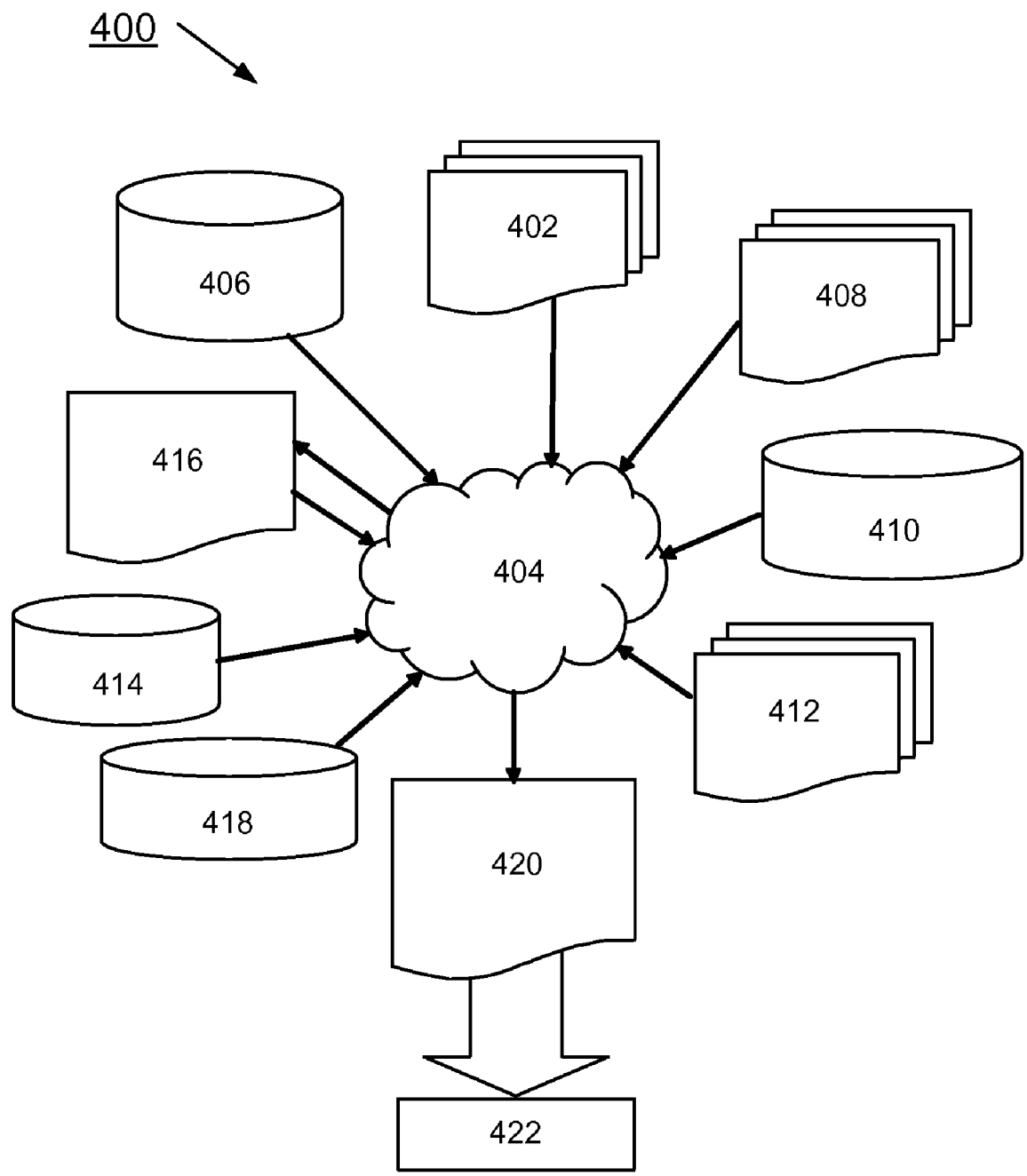
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 400 in the form of schematics or HDL, a hardware-description language, for example, Verilog, VHDL, C, and the like. Design structure 402 is tangibly contained on, for example, one or more machine readable medium. For example, design structure 402 may be a text file or a graphical representation of circuit 200, 202. Design process 404 preferably synthesizes, or translates, circuit 200, 202 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIG. 2 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A wordline voltage boosting circuit for implementing a boosted wordline voltage in a memory comprising:
   a precharge signal;
   a bootstrap capacitor, said bootstrap capacitor being connected to a voltage supply of a wordline driver output stage;
   a switching transistor coupled to said bootstrap capacitor, said switching transistor being controlled by said precharge signal, driving said bootstrap capacitor high, said bootstrap capacitor supplying a boosted voltage level to said voltage supply, providing a boosted voltage level of a selected wordline; and
   a pair of series connected inverters receiving an input of said precharge signal and having an output connected to a second side of said bootstrap capacitor.

2. The wordline voltage boosting circuit as recited in claim 1, wherein said switching transistor includes a P-channel field effect transistor (PFET).

3. The wordline voltage boosting circuit as recited in claim 2, wherein said precharge signal is applied to a gate of said P-channel field effect transistor (PFET), and said P-channel field effect transistor (PFET) is connected between a voltage supply rail and a first side of said bootstrap capacitor supplying the boosted voltage level.

4. The wordline voltage boosting circuit as recited in claim 1, wherein the memory includes a domino read static random access memory (SRAM), and wherein said boosted wordline voltage generated by the wordline voltage boosting circuit enables enhanced read access time and write time of said domino read static random access memory (SRAM).

5. The wordline voltage boosting circuit as recited in claim 1, wherein said bootstrap capacitor is shared across a group of wordline drivers, minimizing required chip area for the wordline voltage boosting circuit.

6. The wordline voltage boosting circuit as recited in claim 1, wherein said precharge signal is applied to a pair of precharge devices, said precharge devices connected between a voltage supply rail and a respective bitline of the memory.

7. The wordline voltage boosting circuit as recited in claim 1, wherein said wordline driver output stage includes a NAND gate receiving a group select signal and a wordline select input, said NAND gate applying an output to an inverter connected to a wordline, said wordline providing an input to a memory cell.

8. A method for implementing a boosted wordline voltage in a memory comprising the steps of:
   providing a bootstrap capacitor, said bootstrap capacitor being connected to a voltage supply of a wordline driver output stage;
   providing a switching transistor coupled to said bootstrap capacitor;
   applying a precharge signal to said switching transistor; said switching transistor being controlled by said precharge signal and driving said bootstrap capacitor high, said bootstrap capacitor supplying a boosted voltage level to said voltage supply, providing a boosted voltage level of a selected wordline; providing said switching transistor coupled to said bootstrap capacitor including providing a P-channel field effect transistor (PFET) connected between a voltage supply rail and a first side of said bootstrap capacitor supplying the boosted voltage level; and
   providing a pair of series connected inverters receiving an input of said precharge signal and having an output connected to a second side of said bootstrap capacitor.

9. The method as recited in claim 8 wherein applying said precharge signal to said switching transistor includes applying said precharge signal to a gate of said P-channel field effect transistor (PFET).

10. The method as recited in claim 8 wherein said bootstrap capacitor is shared across a group of wordline drivers, minimizing required chip area for the wordline voltage boosting circuit.

11. The method as recited in claim 8 wherein said wordline driver output stage includes a NAND gate receiving a group select signal and a wordline select input, said NAND gate applying an output to an inverter connected to a wordline, said wordline providing an input to a memory cell.

12. A design structure embodied in a machine readable medium used in a design process, the design structure comprising:
   a wordline voltage boosting circuit tangibly embodied in the machine readable medium used in the design process, said wordline voltage boosting circuit for implementing boosted wordline voltage in a memory, said wordline voltage boosting circuit including
   a precharge signal;
   a bootstrap capacitor, said bootstrap capacitor being connected to a voltage supply of a wordline driver output stage;
   a switching transistor coupled to said bootstrap capacitor, said switching transistor being controlled by said precharge signal, driving said bootstrap capacitor high, said bootstrap capacitor supplying a boosted voltage level to said voltage supply, providing a boosted voltage level of a selected wordline, and
   a pair of series connected inverters receiving an input of said precharge signal and having an output connected to a second side of said bootstrap capacitor, wherein the design structure, when read and used in the manufacture of a semiconductor chip produces a chip comprising said wordline voltage boosting circuit.

13. The design structure of claim 12, wherein the design structure comprises a netlist, which describes said wordline voltage boosting circuit.

14. The design structure of claim 12, wherein the design structure resides on storage medium as a data format used for the exchange of layout data of integrated circuits.

15. The design structure of claim 12, wherein the design structure includes at least one of test data files, characterization data, verification data, or design specifications.

16. The design structure of claim 12, wherein said bootstrap capacitor is shared across a group of wordline drivers, minimizing required chip area for the wordline voltage boosting circuit.

17. The design structure of claim 12, wherein said wherein said switching transistor includes a P-channel field effect transistor (PFET), and said precharge signal is applied to a gate of said P-channel field effect transistor (PFET).

* * * * *